United States Patent [19]

Mori et al.

[11] Patent Number: 5,356,832
[45] Date of Patent: Oct. 18, 1994

[54] METHOD OF MAKING SURFACE EMISSION TYPE SEMICONDUCTOR LASER

[75] Inventors: Katsumi Mori; Tatsuya Asaka; Hideaki Iwano, all of Nagano, Japan

[73] Assignee: Seiko Epson Corporation, Nagano, Japan

[21] Appl. No.: 999,137

[22] Filed: Dec. 31, 1992

Related U.S. Application Data

[63] Continuation-in-part of Ser. No. 756,981, Sep. 9, 1991, Pat. No. 5,182,757.

[30] Foreign Application Priority Data

Sep. 12, 1990 [JP] Japan .................................. 2-242000

[51] Int. Cl.$^5$ .......................................... H01L 21/20
[52] U.S. Cl. .................................. 437/129; 437/126; 437/133; 437/905; 148/DIG. 95
[58] Field of Search ................ 437/129, 126, 133, 905, 437/105, 106, 107; 148/DIG. 95

[56] References Cited

U.S. PATENT DOCUMENTS

| | | | |
|---|---|---|---|
| 4,637,122 | 1/1987 | Carney et al. | 148/DIG. 95 |
| 4,856,013 | 8/1989 | Iwano et al. | |
| 4,949,351 | 8/1990 | Imanaka. | |
| 5,031,187 | 7/1991 | Orenstein et al. | |
| 5,045,500 | 9/1991 | Mitsui et al. | 437/129 |
| 5,045,897 | 9/1991 | Ahlgren. | |
| 5,052,016 | 9/1991 | Mahbobzadeh et al. | |
| 5,059,552 | 10/1991 | Harder et al. | 437/129 |
| 5,068,868 | 11/1991 | Deppe et al. | |
| 5,084,893 | 1/1992 | Sekii et al. | 372/46 |
| 5,086,430 | 2/1992 | Kapon et al. | |
| 5,181,219 | 1/1993 | Mori et al. | |
| 5,181,221 | 1/1993 | Mori et al. | |
| 5,182,757 | 1/1993 | Mori et al. | |

FOREIGN PATENT DOCUMENTS

| | | |
|---|---|---|
| 2606223 | 6/1988 | France. |
| 61-079280 | 4/1986 | Japan. |
| 1-125990 | 5/1989 | Japan. |
| 1-266779 | 10/1989 | Japan. |
| 4-363081 | 12/1992 | Japan. |

OTHER PUBLICATIONS

Lectures of the 50th Meeting of Applied Physics in Japan (1989), vol. 3, p. 909, 29z-ZG-7, K. Furusawa et al.

Yoo et al.; "Phase-Locked Two-Dimensional Array of Vertical Cavity Surface Emitting Lasers", Jap. Journal of Applied Physics, Extended Abstracts 22th Conf. Solid State Devices and Materials, Aug. 1990; pp. 521–524.

Ibaraki et al.; "CaAs/GaAlAs DBR Surface Emitting Laser with GaAlAs/AlAs and SiO2/TiO2 Reflectors"; Conf. Digest of the 11th IEEE International Semiconductor Laser Conference; Aug. 1988, pp. 164–165.

M. Ogura et al.; "Surface-Emitting Laser Diode with Distributed Bragg Reflector and Buried Heterostructure", Electronics Letters, 26 (1990) 4. Jan., No. 1, pp. 18–19.

Schrerer et al.; "Fabrication of Electrically Pumped Vertical Cavity Microlasers"; Lasers and Electro-Optics Society Annual Meeting Conference Proceedings, Oct., 1989, pp. 289–290.

J. L. Jewell et al.; "Surface-Emitting Microlasers for Photonic Switching and Interchip Connections", Optical Engineering, vol. 29, No. 3, Mar. 1990.

*Primary Examiner*—Tom Thomas
*Assistant Examiner*—Kevin M. Picardat
*Attorney, Agent, or Firm*—Oliff & Berridge

[57] ABSTRACT

A surface emission type semiconductor laser includes a plurality of semiconductor layers defining at least one resonator in a direction perpendicular to the semiconductor substrate of the laser, the layers including at least a cladding layer in the semiconductor layers being formed into at least one column-like semiconductor layer extending in a direction perpendicular to the semiconductor substrate, and a II-VI group compound semiconductor epitaxial layer buried around the at least one column-like semiconductor layer. If a plurality of column-like semiconductor layers are to be formed by a separation groove, these column-like semiconductor layers are separated from one another, the II-VI group compound semiconductor epitaxial layer being buried in the separation groove.

17 Claims, 14 Drawing Sheets

FIG.9a  FIG.9b  FIG.9c  FIG.9d  FIG.9e
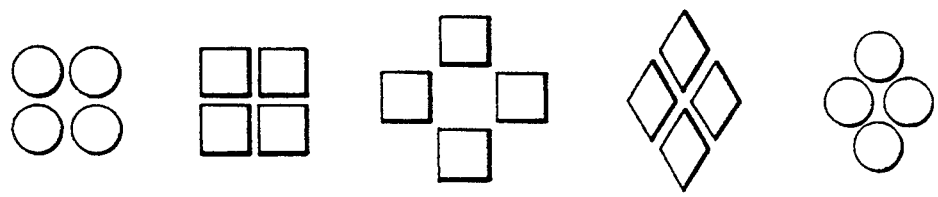
FIG.9f  FIG.9g  FIG.9h  FIG.9i  FIG.9j
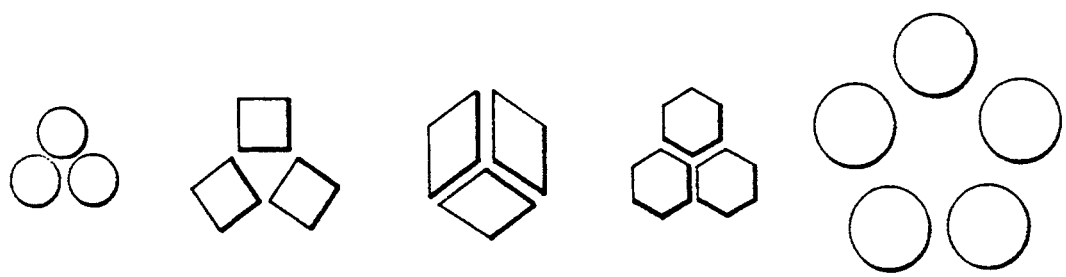
FIG.9k  FIG.9ℓ  FIG.9m
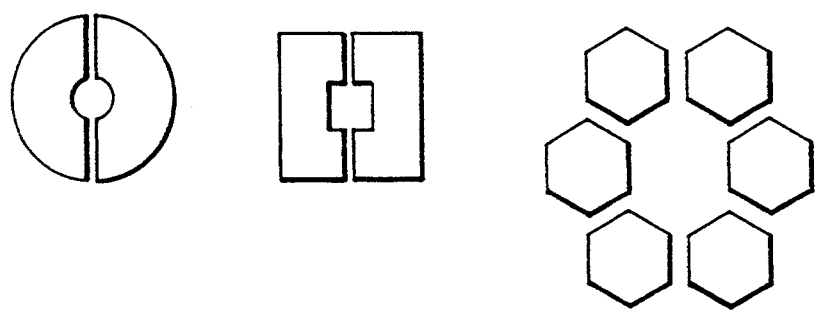

METHOD OF MAKING SURFACE EMISSION TYPE SEMICONDUCTOR LASER

This is a Continuation-in-Part of Application Ser. No. 07/756,981, filed Sep. 9, 1991, now U.S. Pat. No. 5,182,757.

BACKGROUND OF THE INVENTION

1. Field of the Invention

The present invention relates to a surface emission type semiconductor laser adapted to emit a laser beam in a direction perpendicular to the substrate thereof and a method of making such a semiconductor laser.

2. Description of the Related Art

A surface emission type laser including a resonator disposed in a direction perpendicular to the substrate thereof is disclosed in Lectures of the 50-th Meeting of Applied Physics in Japan (1989), Vol. 3, pp. 909, 29a-ZG-7. In accordance with the prior art, as shown in FIG. 12, there is first provided an n-type GaAs substrate 602 on which an n-type AlGaAs/AlAs multilayer film 603, an n-type AlGaAs cladding layer 604, a p-type GaAs active layer 605 and a p-type AlGaAs cladding layer 606 are sequentially grown and formed. The multi-layered structure is then etched while leaving a column-like part at the top thereof. The remaining column-like part is enclosed by a buried layer which is formed by sequentially growing a p-type layer 607, n-type layer 608, p-type layer 609 and p-type layer 610 all of which are of AlGaAs in liquid phase epitaxy method. Thereafter, a multi-layer dielectric film 611 is deposited on the cap layer of p-type AlGaAs 610 at the top thereof. Finally, p- and n-type ohmic electrodes 612 and 601 are formed respectively on the top and bottom end faces of the structure thus formed. In such a manner, a surface emission type semiconductor laser will be completed.

The buried layer (607–608) formed in the above manner defines a p-n junction which is used as means for preventing current from leaking to layer sections other than the active layer section.

However, by using such a p-n junction, it is difficult to provide a sufficient current restriction; and it cannot suppress any reactive current perfectly. Due to generation of heat in the component, therefore, the surface emission type semiconductor laser constructed in accordance with the prior art is impractical in that it is difficult to perform a continuous generating drive in room temperature. It is thus important to restrict the reactive current in the surface emission type semiconductor laser.

Where the buried layer is of a multi-layered structure to form a p-n junction as in the prior art, the p-n interface in the buried layer should be positioned in consideration of a position of the interface between each of the adjacent column-like grown layers. It is difficult to control the thickness of each layer in the multi-layered structure. It is therefore very difficult to consistently produce surface emission type semiconductor lasers.

If a buried layer is formed around the column by the liquid phase epitaxy method as in the prior art, there is a high risk of breaking-off of the column-like part, leading to a reduced yield. The prior art was thus subject to a structural limitation in improving its characteristics.

The prior art raises further problems even when it is applied to various other devices such as laser printers and the like.

For example, laser printers can have an increased freedom of design as in simplifying the optical system or in decreasing the optical path, since the source of light (semiconductor laser and so on) has a relatively large size of light spot equal to several tens μm and if a light emitting element having an increased intensity of light emission is used in the laser printers.

With the surface emission type semiconductor laser constructed according to the prior art, the optical resonator is entirely buried in a material having a refractive index higher than that of the resonator. Light rays are mainly guided in the vertical direction. As a result, a spot of light emission in the basic generation mode will have a diameter equal to about 2 μm even if the shape of the resonator is modified in the horizontal direction.

It has been proposed that the light spots be located close to each other up to about 2 μm and that a plurality of light sources be used to increase the size of a spot. From the standpoint of reproductiveness and yield, however, it is very difficult with the prior art to bury a plurality of resonators spaced away from one another by several microns using the LPE method. Even if such a burying can be successfully carried out, the spots cannot be united into a single spot since the transverse leakage of light is little.

It is also necessary that a plurality of light spots are formed into a single beam of light and that the laser beams each consisted of plural spots are in phase to increase the intensity of light emission. However, the prior art could not produce a surface emission type semiconductor laser which emits a plurality of laser beams close to one another up to a distance by which one of the laser beams are influenced by the other, in order to synchronize the laser beams in phase.

SUMMARY OF THE INVENTION

It is therefore an object of the present invention to provide a high-efficiency surface emission type semiconductor laser which is of a complete current restrictable structure provided by improving the material from which the buried layer is made and which can be produced in a very simple manner, and to provide a method of making the same.

Another object of the present invention is to provide a surface emission type semiconductor laser which includes a plurality of light emitting portions located close to one another and which can synchronize laser beams from the light emitting portions in phase and to provide a method of making the same.

Still another object of the present invention is to provide a surface emission type semiconductor laser which can emit a single laser beam formed by the in-phase laser beams from the light emitting portions, said single laser beam having a relatively large light spot and a reduced angle of radiation and to provide a method of making the same.

To this end, a surface emission type semiconductor laser for emitting a beam in a direction perpendicular to the semiconductor substrate, comprises an optical resonator including a pair of reflecting mirrors having different reflectivities and a plurality of semiconductor layers located between said reflecting mirrors, the layers including at least a cladding layer in said semiconductor layers being formed into one or more column-like semiconductor layers (portions), and a II-VI group compound semiconductor epitaxial layer buried around (surrounding) said column-like semiconductor layers. The II-VI group compound semiconductor epitaxial layer may be formed of a combination of two, three or four elements which include II-group elements such as Zn, Cd and Hg and VI-group elements such as O, S, Se and Te. It is also desirable that the lattice constant of the II-VI group compound semiconductor epitaxial layer is equal to that of the column-like semiconductor layers. It is preferred that the semiconductor layer defining the resonator is a III-V group compound semiconductor epitaxial layer of GaAs, GaAlAs, GaAsP, InGaP, InGaAsP, InGaAs, AlGaAsSb or the like.

Since the II-VI group compound semiconductor epitaxial layer has a high resistance, the buried layer formed by this high-resistance layer can prevent a leakage of incoming current thereinto. This can attain very effective current restriction. Furthermore, the threshold level of current can be decreased since the reactive current is reduced. As a result, the present invention can provide a surface emission type semiconductor laser which generates less heat and can continuously perform the generation in room temperature. Since the buried layer is not multi-layered, it can be easily formed with consistency. Furthermore, the II-VI group compound semiconductor epitaxial layer can be formed by any other suitable manner other than the liquid phase epitaxy method, such as vapor phase epitaxy method, resulting in improvement of the yield in forming the column-like semiconductor layers. If the vapor phase epitaxy method is used, a buried layer can be reliably formed while permitting a plurality of column-like semiconductor layers to be arranged closer to one another, even if a space in which the buried layer is to be formed is small.

If the thickness of the semiconductor contact layer on the exit side of the optical resonator is equal to or less than 3.0 $\mu$m, the light absorption can be reduced in the contact layer.

If the cross-section of the column-like semiconductor layer parallel to the Semiconductor substrate is circular or regular polygonal, it can provide a fairly circular spot beam. If the diameter or diagonal of the cross-section just mentioned is equal to or less than 10 $\mu$m, NFP (Near Field Pattern) mode becomes 0-order basic code.

If the optical resonator has a single column-like semiconductor layer, the reflecting mirror on the exit side thereof may be formed at a position opposite to the end face of the column within the range of said end face. In this case, the refractive index waveguide structure may be either of rib waveguide type or buried type.

In this surface emission type semiconductor laser, the optical resonator may include separation groove(s) for separating one of the column-like semiconductor layers from another adjacent one. The II-VI group compound semiconductor epitaxial layer is buried in the separation groove and a light emitting portion is formed on each of the column-like semiconductor layers. The separation groove should not reach the active layer in the semiconductor layers defining the optical resonator. In such a manner, the respective light emitting portions are influenced by each other through the active layer, such that the lights from the light emitting portions will be in phase.

When it is desired to increase the light emission spot, a II-VI group compound semiconductor epitaxial layer which is transparent for the wavelength of the exit laser beam may be buried in the separation groove. The exit side reflecting mirror is formed through a region opposite to the end face of each of the column-like layers and the II-VI group compound semiconductor epitaxial layer buried in the separation groove. Thus, a region sandwiched between each adjacent light emitting portion also serves as a vertical resonating structure. Light leaked into such a region effectively contributes to the laser generation to increase the light emission spot in size. Since the synchronized laser beams are superimposed one over another, the light output increases and the angle of radiation decreases. With a GaAs laser generally used as a semiconductor layer of a resonator, the II-VI group compound semiconductor epitaxial layer transparent for the wavelength of the laser beam therefrom may be made of either ZnSe, Zns, ZnSSe, ZnCdS or CdSSe. If the separation groove is perpendicular to the semiconductor substrate, light rays slantingly entering the separation groove can be totally reflected to increase the confinement of light, utilizing a differential refraction. If the cross-section of the separation groove parallel to the semiconductor substrate has a width ranging between 0.5 $\mu$m and 10 $\mu$m, the order of the transverse generation mode measured from NFP becomes 0-order basic mode.

The present invention also provides a method of making a surface emission type semiconductor laser for emitting a laser beam in a direction perpendicular to the semiconductor substrate, comprising the steps of forming a number of semiconductor layers on the semiconductor substrate to define an optical resonator, forming a photoresist mask on said semiconductor layers, etching at least the cladding layer in said semiconductor layers by the use of said photoresist mask to form one or more column-like semiconductor layers, and forming a II-VI group compound semiconductor epitaxial layer buried around said column-like semiconductor layers in vapor phase epitaxy method.

Since the buried layer is formed by the vapor phase epitaxy method, the column-like semiconductor layers will not be deformed or damaged. It is desirable that the etching step is terminated leaving a part of the cladding layer without exposure of the active layer underlying the cladding layer. Once the active layer is exposed externally, any impurity may be deposited thereon to create a defective crystal.

If the photoresist mask used in the etching step is formed by reactive-ion etching a photoresist layer which has been hard baked, the side walls of the photoresist mask becomes perpendicular to the semiconductor substrate. When a column-like semiconductor layers are formed by the reactive-ion beam etching process using such a photoresist mask, the column-like semiconductor layers may be finely worked to have vertical side walls.

When a hard baked photoresist mask having vertical sides is formed, it is preferred that a film of Ti, $SiO_2$ or SiN is formed on the mask and also that a second photoresist layer is further formed on the formed film. When a resist pattern is formed using the second photoresist layer in the photolithograph step, the resist pattern is not necessarily required to have its sides perpendicular to the semiconductor substrate. When the resist pattern is used as a mask to etch the film for forming a film mask, the sides of the film mask will be perpendicular to the semiconductor substrate. When the hard baked photoresist layer is etched by the RIE process using such a film mask, the photoresist mask can be more easily formed to have vertical sides.

The thickness of the film mask is preferably smaller than the thickness of the underlying hard baked photoresist layer, and preferably ranges from 1000 Angstroms to 1 μm. Thus, the film mask having sides perpendicular to the semiconductor substrate can be formed without creating any side etching.

It is also preferred that a polycrystalline etching stop layer having an etching rate lower than the etching rate of the II-VI group compound semiconductor epitaxial layer is formed of SiO2 or SiN between the multilayered semiconductor layer providing a column-like light emitting portion and the hard baked photoresist layer. When the II-VI group compound semiconductor epitaxial layer is vapor grown about the column-like light emitting portion, a polycrystalline II-VI group compound semiconductor layer is formed on the etching stop layer and protrudes beyond the II-VI group compound semiconductor epitaxial layer. When the surface of the II-VI group compound semiconductor epitaxial layer is etched to be substantially flush with the surface of the column-like light emitting portion, it is preferred that a layer having a flat surface has been previously formed on the single crystalline and polycrystalline II-VI group compound semiconductor layers. Thus, the etching can be continued while maintaining the surface flat. After the polycrystalline II-IV group compound semiconductor layer has been completely removed, the underlying etching stop layer will be exposed. Since the etching stop layer has an etching rate lower than the etching rate of the II-VI group compound semiconductor epitaxial layer, the surface of the buried layer can be etched to be substantially flush with the surface of the column-like light emitting portion when the end of etching is set depending on the degree of exposure in the etching stop layer.

BRIEF DESCRIPTION OF THE DRAWINGS

FIG. 8(a) shows the shape of the surface emission type semiconductor laser of the prior art on the exit side thereof; FIG. 8(b) shows an intensity profile in the near field pattern of the semiconductor laser shown in FIG. 8(a); FIG. 8(c) shows the shape of the semiconductor laser of the present embodiment at the exit side; and FIG. 8(d) shows an intensity profile of the near field pattern of the semiconductor laser shown in FIG. 8(c).

FIGS. 9(a) to (m) schematically illustrate various shapes of surface emission type semiconductor lasers constructed according to further embodiments of the present invention at the exit sides thereof.

DETAILED DESCRIPTION OF PREFERRED EMBODIMENTS

Figure 1:
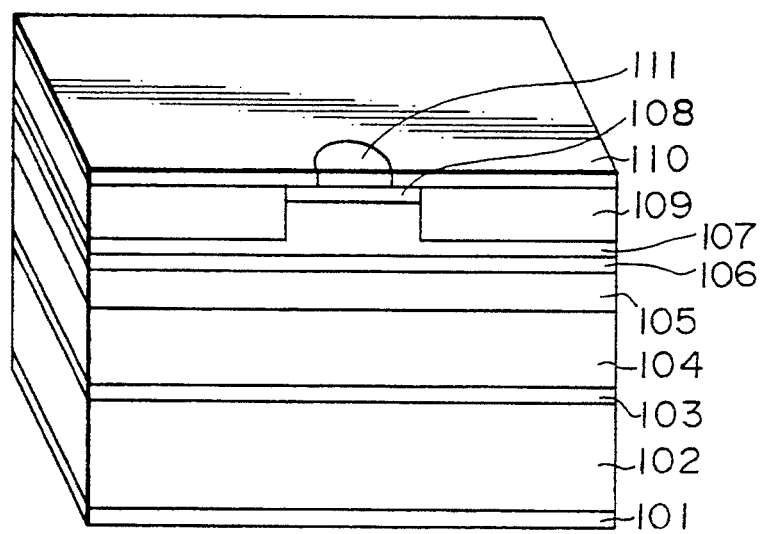
FIG. 1 is a perspective view, partially in section, of a light emitting portion of one embodiment of a semiconductor laser constructed in accordance with the present invention.

Referring to FIGS. 1 and 2, there is shown a semiconductor laser 100 constructed in accordance with one embodiment of the present invention.

The semiconductor laser 100 comprises a substrate of n-type GaAs 102 over which a buffer layer of n-type GaAs 103 is formed. Over the buffer layer 103, there are formed 30 pairs of distribution reflection type multilayer film mirror 104 which include an n-type $Al_{0.7}Ga_{0.3}As$ layer and an n-type $Al_{0.1}Ga_{0.9}As$ layer and have a reflectivity equal to or higher than 98% against light rays having their wavelength substantially equal to 870 nm. On the multi-layer film mirror 104, there are sequentially formed on a cladding layer of n-type $Al_{0.4}Ga_{0.6}As$ 105, an active layer of p-type GaAs 106, another cladding layer of p-type $Al_{0.4}Ga_{0.6}As$ 107, and a contact layer of p-type $Al_{0.1}Ga_{0.9}As$ 108, utilizing the epitaxial growth in 35 the MOCVD process (see FIG. 2(a)). At this time, for example, the formation of these layers was carried out under such a condition that the temperature on growth is 700° C. and the pressure on growth is 150 Torr, and used organic metals such as TMGa (trimethyl gallium) and TMAl (trimethyl aluminum) as III- group materials, $AsH_3$ as V-group material, $H_2Se$ as n-type dopant and DEZn (diethyl zinc) as p-type dopant.

After growth, an $SiO_2$ layer 112 is formed on the top of the multi-layered structure by the thermal CVD process. By the use of the reactive ion beam etching process (RIBE process), the multi-layered structure is etched up to the middle of the cladding layer of p-type $Al_{0.4}Ga_{0.6}As$ 107, leaving a column-like light emitting portion covered with a hard baked resist layer 113 (FIG. 2(b)). The etching gas is a mixture of chlorine with argon under a pressure of $1 \times 10^{-3}$ Torr. The leading voltage used therein is equal to 400 V. The purpose of the etching of the cladding layer 107 up to the middle thereof is to provide a rib waveguide type refraction waveguide structure which can confine injected carriers and light rays in the active layer.

Figure 2A:
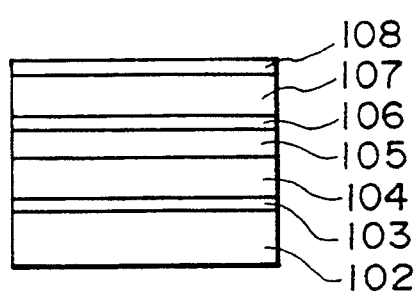
FIGS. 2a-2e are cross-sectional views of the semiconductor laser shown in FIG. 1, illustrating the process of making it.
Figure 2D:
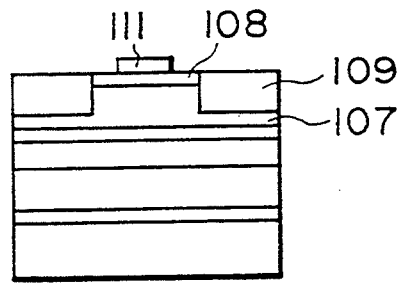
Figure 2B:
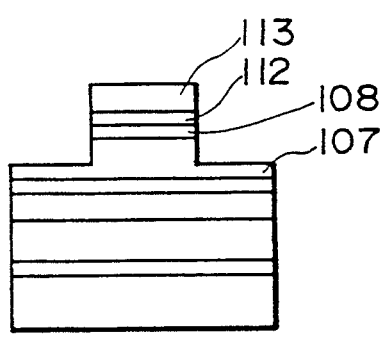
Figure 2E:
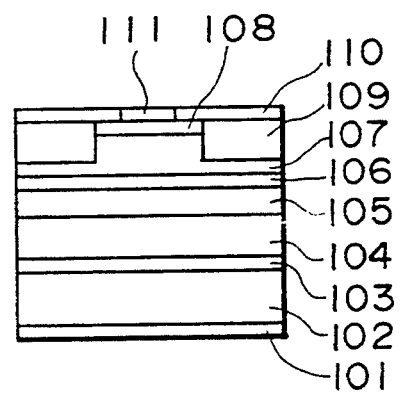
Figure 2C:
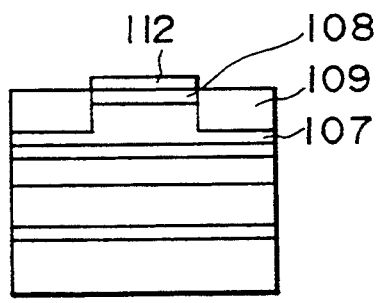

After the resist 113 has been removed, a layer of $ZnS_{0.06}Se_{0.94}$ 109 which is in lattice alignment with GaAs is then formed by causing this layer to grow around the column-like portion using the MBE or MOCVD process (FIG. 2(c)).

Four pairs of multi-layered dielectric film mirror of SiO$_2$/a-Si 111 are then formed on the top of the column-like portion by the use of electron beam deposition. Dry-etching is then used to remove a part of the mirror 111, leaving a region slightly smaller than the diameter of the light emitting portion (FIG. 2(d)). The reflectivity of the multi-layered dielectric film mirror 111 is 94% for wavelength of 870 nm.

Thereafter, a p-type ohmic electrode 110 is deposited on all the top face except the multi-layered dielectric film mirror 111. An n-type ohmic electrode 101 is further deposited over the bottom face of the semiconductor substrate 102. In an atmosphere of N$_2$, the entire structure is alloyed at 420° C. to provide a surface emission type semiconductor laser (FIG. 2(e)).

The surface emission type semiconductor laser thus formed provides a very effective current restriction since the buried layer 109 of ZnS$_{0.06}$Se$_{0.94}$ has a resistance equal to or higher than one G and there is no injection current into the buried layer. Since it is not required that the buried layer is any multi-layered structure, it can be more easily grown with an increased reproductiveness (consistency) from one batch to another. The utilization of the rib waveguide structure using the ZnS$_{0.06}$Se$_{0.94}$ layer having its refractive index sufficiently smaller than that of GaAs can realize a more effective light confinement.

Figure 3:
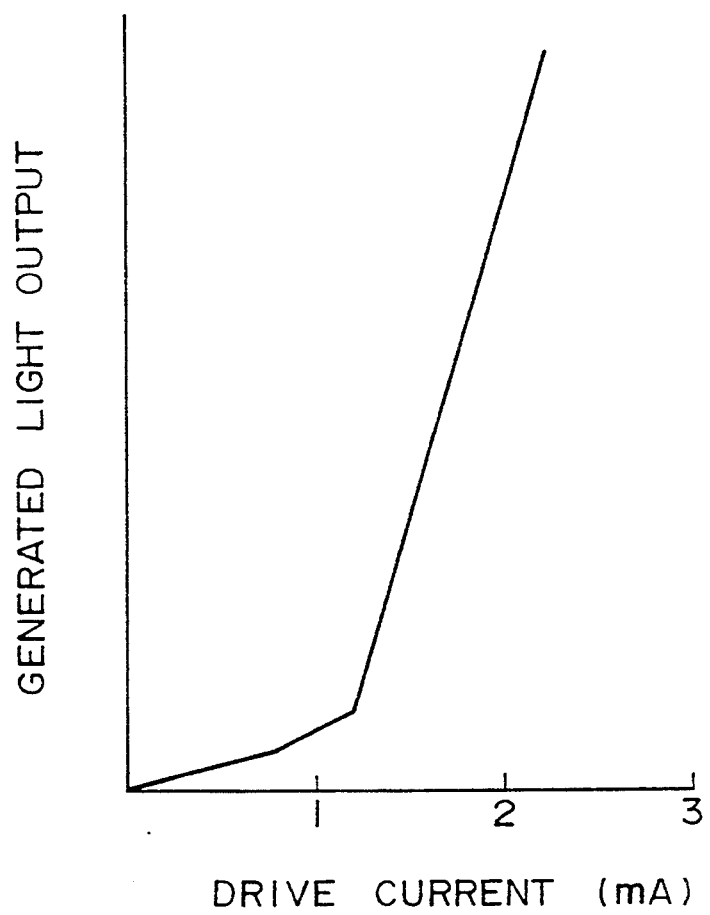
FIG. 3 is a graph illustrating the relationship between the drive current and the generated light output in the semiconductor laser shown in FIG. 1.

FIG. 3 shows the relationship between the drive current and the generated light output in the surface emission type semiconductor laser according to this embodiment. It will be apparent from this graph that the continuous generation can be accomplished at room temperature and the threshold is very low, or equal to one mA. Furthermore, the external differential quantum efficiency is increased and the characteristics of the laser is improved by restricting the reactive current.

If the cross-sectional shape of the column-like portion in the surface emission type semiconductor laser according to this embodiment of the present invention is of a circle or regular polygon such as square or regular octagon, a finely circular spot of beam can be provided. However, if this cross-sectional shape is of any configuration other than the above ones, such as rectangle or trapezoid, the cross-section of the laser beam will be ellipse or multi-mode. This is not desirable in applying the semiconductor laser to the devices.

TABLE 1

| Diameter of Column Cross-Section | Mode of Near Field Pattern |
| --- | --- |
| 2 μm | Zero-Order Basic Mode |
| 5 μm | Zero-Order Basic Mode |
| 10 μm | Zero-Order Basic Mode |
| 12 μm | First-Order Mode |
| 15 μm | First-Order Mode |

Table 1 shows the relationship of near field pattern relative to the diameter of the cross-section of the column-like portion in the surface emission type semiconductor laser according to this embodiment of the present invention. It will be apparent therefrom that if the diameter is equal to or less than 10 μm, the generation is carried out in the basic mode.

It is preferred that the contact layer 108 in the surface emission type semiconductor laser according to this embodiment of the present invention is of a thickness equal to or less than 3.0 μm. This is because of reduction of the light absorption in the contact layer. Such a thickness is more preferably less than 0.3 μm because the element resistance is reduced and the external differential quantum efficiency is increased.

Figure 4:
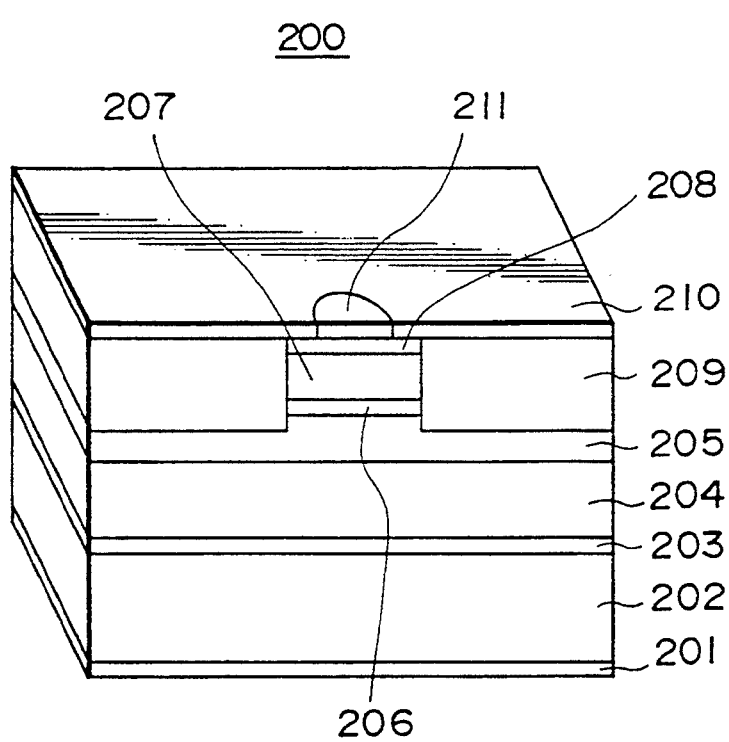
FIG. 4 is a perspective view, partially in section, of a light emitting portion of another embodiment of a semiconductor laser constructed in accordance with the present invention.

Referring now to FIGS. 4 and 5, there is shown a semiconductor laser 200 constructed in accordance with another embodiment of the present invention.

The semiconductor laser 200 comprises a substrate of n-type GaAs 202 over which a buffer layer of n-type GaAs 203 is formed. Over the buffer layer 203, there are formed 30 pairs of distribution reflection type multi-layer film mirror 204 which include an n-type AlAs layer and an n-type Al$_{0.1}$Ga$_{0.9}$As layer and have a reflectivity equal to or higher than 98% against light rays having their wavelength substantially equal to 870 nm. On the multi-layer film mirror 204, there are sequentially formed a cladding layer of n-type Al$_{0.4}$Ga$_{0.6}$As 205, an active layer of p-type GaAs 206, another cladding layer of p-type Al$_{0.4}$Ga$_{0.6}$As 207 and a contact layer of p-type Al$_{0.1}$Ga$_{0.9}$As 208, utilizing the epitaxial growth in MOCVD process (see FIG. 5(a)). At this time, for example, the formation of these layers was carried out under such a condition that the temperature on growth is 700° C. and the pressure on growth is 150 Torr, and used organic metals such as TMGa (trimethyl gallium) and TMA1 (trimethyl aluminum) as III-group materials, AsH$_3$ as V-group material, H$_2$Se as n-type dopant and DEZn (diethyl zinc) as p-type dopant.

After growth, an SiO$_2$ layer 212 is formed on the top of the multi-layered structure by the thermal CVD process. By the use of the reactive ion beam etching process (RIBE process), the multi-layered structure is etched up to the middle of the cladding layer of n-type Al$_{0.4}$Ga$_{0.6}$As 205, leaving a column-like light emitting portion covered with a hard baked resist layer 213 (FIG. 5(b)). The etching gas is a mixture of chlorine with argon under a pressure of $1 \times 10^{-3}$ Torr. The leading voltage used therein is equal to 400V.

Figure 5A:
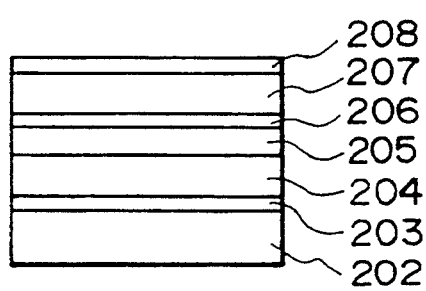
FIGS. 5a-5e are cross-sectional views of the semiconductor laser shown in FIG. 4, illustrating the process of making it.
Figure 5D:
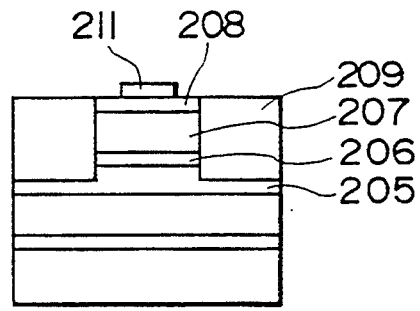
Figure 5B:
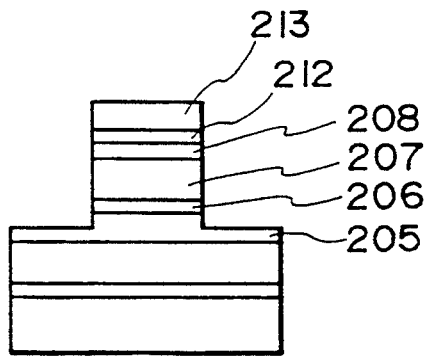
Figure 5E:
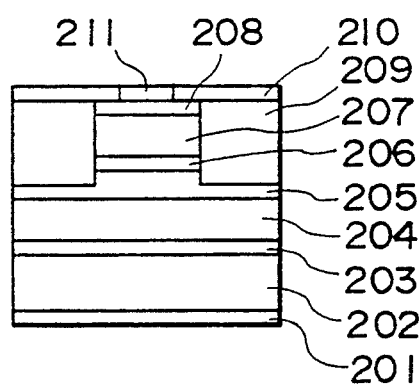
Figure 5C:
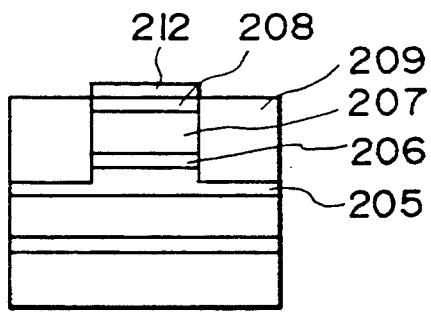

After the resist 213 has been removed, a layer of ZnS$_{0.06}$Se$_{0.94}$ 209 which is in lattice alignment with GaAs is then formed by causing this layer to grow around the column-like portion using the MBE or MOCVD process (FIG. 5(c)).

Four pairs of multi-layered dielectric film mirror of SiO$_2$/a-Si 211 are then formed on the top of the column-like portion by the use of electron beam deposition. Dry etching is then used to remove a part of mirror 211, leaving a region slightly smaller than the diameter of the light emitting portion (FIG. 5(d)). The reflectivity of the multi-layered dielectric film mirror 211 is 94% for wavelength of 870 nm.

Thereafter, a p-type ohmic electrode 21 0 is deposited on all the top face except the multi-layered dielectric film mirror 211. An n-type ohmic electrode 201 is further deposited over the bottom face of the semiconductor substrate 202. In an atmosphere of N$_2$, the entire structure is alloyed at 420° C. to provide a surface emission type semiconductor laser (FIG. 5(e)).

The surface emission type semiconductor laser thus formed provides a very effective current restriction since the buried layer of ZnS$_{0.06}$Se$_{0.94}$ has a resistance equal to or higher than one G and there is no injection current into the buried layer. Since it is not required that the buried layer is any multi-layered structure, it can be more easily grown with an increased reproductiveness from one batch to another. The utilization of the rib waveguide structure using the ZnS$_{0.06}$Se$_{0.94}$ layer having its refractive index sufficiently smaller than that of GaAs can realize a more effective light confinement with the covering type refraction waveguide structure in which the active layer is buried.

The active GaAs layer may be replaced by an active layer made of AlGaAs with the equivalent advantage. Even if the column-like portion is formed of any one of the other III-V group compound semiconductors, the equivalent advantage can be provided by selecting any suitable one of the II-VI group compound semiconductor to form the buried layer.

Figure 6:
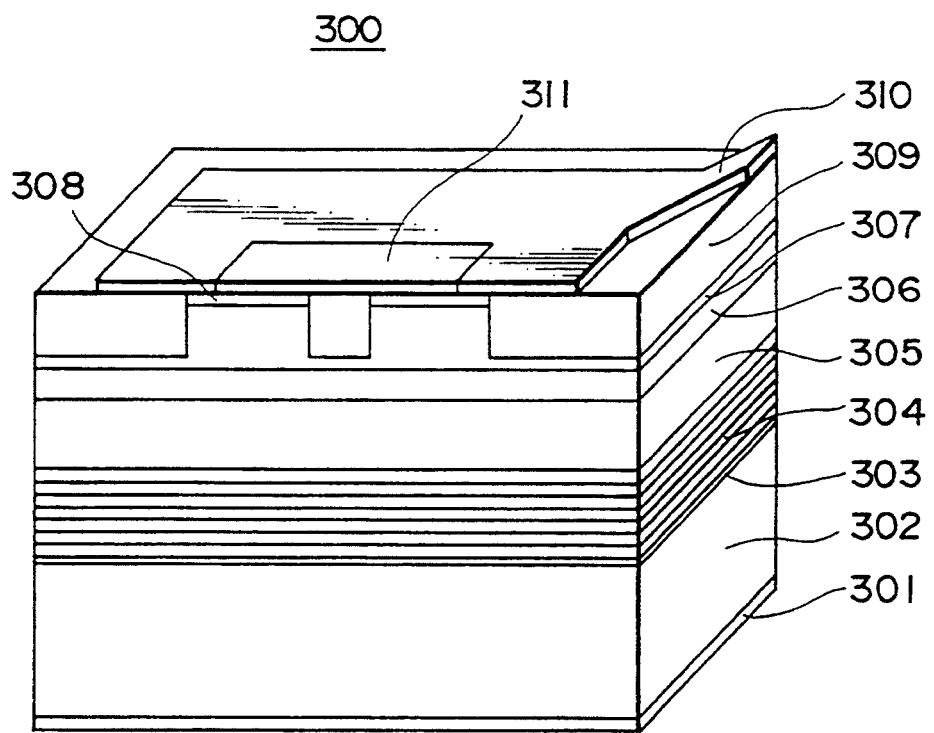
FIG. 6 is a perspective view, partially in section, of a light emitting portion of a surface emission type semiconductor laser constructed in accordance with the present invention, the semiconductor laser adapted to generate laser beams synchronized in phase.

Referring next to FIGS. 6 and 7, there is shown still another embodiment of a phase-synchronization type semiconductor laser 300 constructed in accordance with the present invention, which can increase the dimension of the emission spot.

The semiconductor laser 300 comprises a substrate of n-type GaAs 302 over which a buffer layer of n-type GaAs 303 is formed. Over the buffer layer 303, there are formed 25 pairs of distribution reflection type multilayer film mirror 304 which include an n-type $Al_{0.9}Ga_{0.1}As$ layer and an n-type $Al_{0.2}Ga_{0.8}As$ layer and have a reflectivity equal to or higher than 98% against light rays having their wavelength substantially equal to 780 ±30 nm. On the multi-layer film mirror 304, there are sequentially formed a cladding layer of n-type $Al_{0.5}Ga_{0.5}As$ 305, an active layer of p-type $Al_{0.13}Ga_{0.87}As$ 306, another cladding layer of p-type $Al_{0.5}Ga_{0.5}As$ 307 and a contact layer of p-type $Al_{0.15}Ga_{0.85}As$ 308, utilizing the epitaxial growth in the MOCVD process (see FIG. 7(a)). At this time, for example, the formation of these layers was carried out, for example, under such a condition that the temperature on growth is 720° C. and the pressure on growth is 150 Torr, and used organic metals such as TMGa (trimethyl gallium) and TMAl (trimethyl aluminum) as III-group materials, $AsH_3$ as V-group material, $H_2Se$ as n-type dopant and DEZn (diethyl zinc) as p-type dopant.

After the growth, a $SiO_2$ layer is formed on the top of the multi-layered structure in the atmospheric pressure by the thermal CVD process. A photoresist is then applied over the $SiO_2$ layer and baked at a raised temperature to form a hard baked resist. A further $SiO_2$ layer is formed over the hard baked resist by the EB deposition.

The respective layers formed on the substrate are then etched by the use of reactive ion etching process (RIE process). The $SiO_2$ layer formed on the hard baked resist 313 is first subjected to the conventional photolithograph to form a necessary resist pattern. This resist pattern is then used as a mask to perform the RIE process against the $SiO_2$ layer. For example, the RIE process may be carried out by using $CF_4$ gas under a pressure of 4.5 Pa and an input RF power of 150W and by controlling the sample holder at 20° C. This $SiO_2$ layer is then utilized as a mask to etch the hard baked resist 313 by the RIE process which uses, for example, $O_2$ gas under a pressure of 4.5 Pa and an input power of 150W and controls the sample holder at 20° C. At the same time, the resist pattern initially formed on the $SiO_2$ layer is also etched. In order to etch both the $SiO_2$ layer left in the pattern and the $SiO_2$ layer 312 formed on the epitaxial layer simultaneously, the etching is again performed by the use of $CF_4$ gas. By using the thin $SiO_2$ layer as a mask and performing the RIE process which is one of the dry etching processes against the hard baked resist 313, the latter may include side walls perpendicular to the substrate while maintaining the necessary pattern (FIG. 7(b)).

Figure 7A:
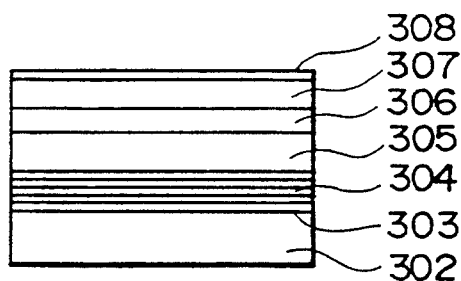
FIGS. 7a-7f are cross-sectional views of the semiconductor laser shown in FIG. 6, illustrating the process of making it.
Figure 7D:
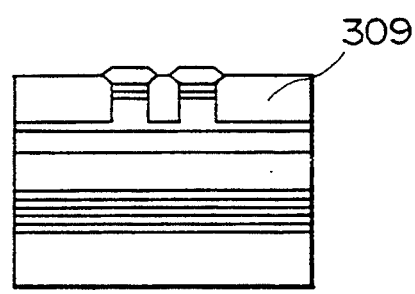
Figure 7B:
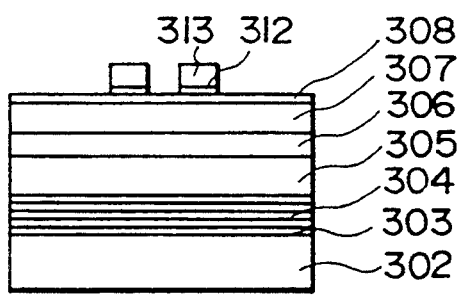
Figure 7E:
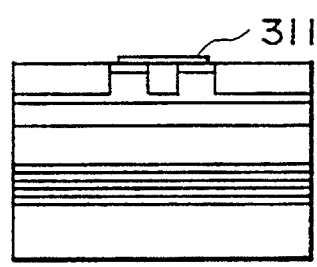
Figure 7C:
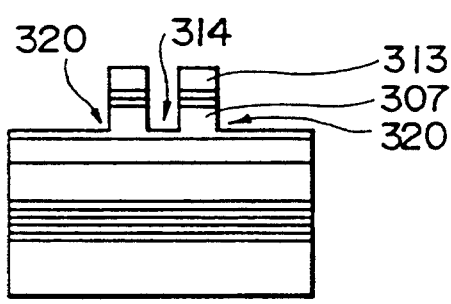
Figure 7F:
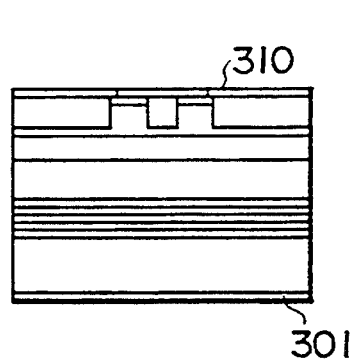

The hard baked resist 313 having such vertical side walls is used as a mask in the reactive ion beam etching (RIBE) process so that the cladding layer of p-type $Al_{0.5}Ga_{0.5}As$ 307 is etched up to its middle, leaving a plurality of column-like light emitting portions (FIG. 7(c)) The etching gas used herein is a mixture of chlorine with argon under a pressure equal to $5 \times 10^{-4}$ Torr and a plasma generating voltage equal to 400V The RIBE process is carried out at the current density of ion equal to 400 $\mu A/cm^2$ on the etching sample while maintaining the sample holder at 20° C. The purpose of etching the cladding layer 307 up to its middle is to provide a refraction waveguide type rib waveguide structure for confining the horizontal injection carriers and light rays in the active layer such that a part of the light rays can be transmitted in the horizontal direction within the active layer.

If the RIBE process in which an ion beam is irradiated perpendicular to the hard baked resist 313 having its vertical side walls and the etching sample to etch them is used, the light emitting portions 320 arranged closed to each other can be separated from each other by a separation groove 314 and at the same time it is possible to produce a vertical light resonator which is required to improve the characteristics of the surface emission type semiconductor laser.

After the hard baked resist 313 has been removed, the MBE or MOCVD process is used to grow a layer of $ZnS_{0.06}Se_{0.94}$ 309 around the light emitting portions, such as buried layer serving as a II-VI group compound epitaxial layer which is in lattice alignment with $Al_{0.5}Ga_{0.5}As$ (FIG. 7(d)). This buried layer 309 is transparent for the generation wavelength of the surface emission type semiconductor laser 300.

Next, the $SiO_2$ layer and polycrystalline ZnSSe produced thereon are removed. Thereafter, four pairs of multi-layered dielectric film mirror 311 made of $SiO_2$/a-Si are formed on the top of the multi-layered structure by means of electron beam deposition. Dry etching is then used to remove a part of the mirror 311 (FIG. 7(e)). The reflectivity of the multi-layered dielectric film mirror at wavelength of 780 nm is 95% or more. Since the multilayered dielectric film mirror 311 is also formed over the separation groove 314 buried with ZnSSe, a vertical resonator structure also is formed at the region between the adjacent light emitting portions. As a result, light rays leaked into the separation groove 314 effectively contributes to the laser generation. Since the leaked light rays are utilized, the emitted light can be synchronized with the phase at the light emitting portions 320.

Thereafter, a p-type ohmic electrode 310 is deposited on the top face except the multi-layered dielectric film mirror 311. An n-type ohmic electrode 301 is deposited on the bottom face of the substrate. The structure thus formed is alloyed at 420° C. in the atmosphere of $N_2$ to complete the surface emission type semiconductor laser 300 (FIG. 7(f)). The n-type ohmic electrode 310 on the exit side is formed to connect with the contact layer 308 in each of the light emitting portion.

Since the emission type semiconductor laser produced according to this embodiment utilizes the epitaxial ZnSSe layer 309 as a buried layer, it can have a resistance equal to or higher than one G, which is higher than that of the prior art blocking structure using a counter bias at the p-n junction in the AlGaAs layer. This provides an optimum current blocking structure. Moreover, the light leaked from the light emitting portion 320 can be effectively utilized since the buried layer is made of a transparent material having less absorption for the generation wavelength of 780 nm.

Figure 12:
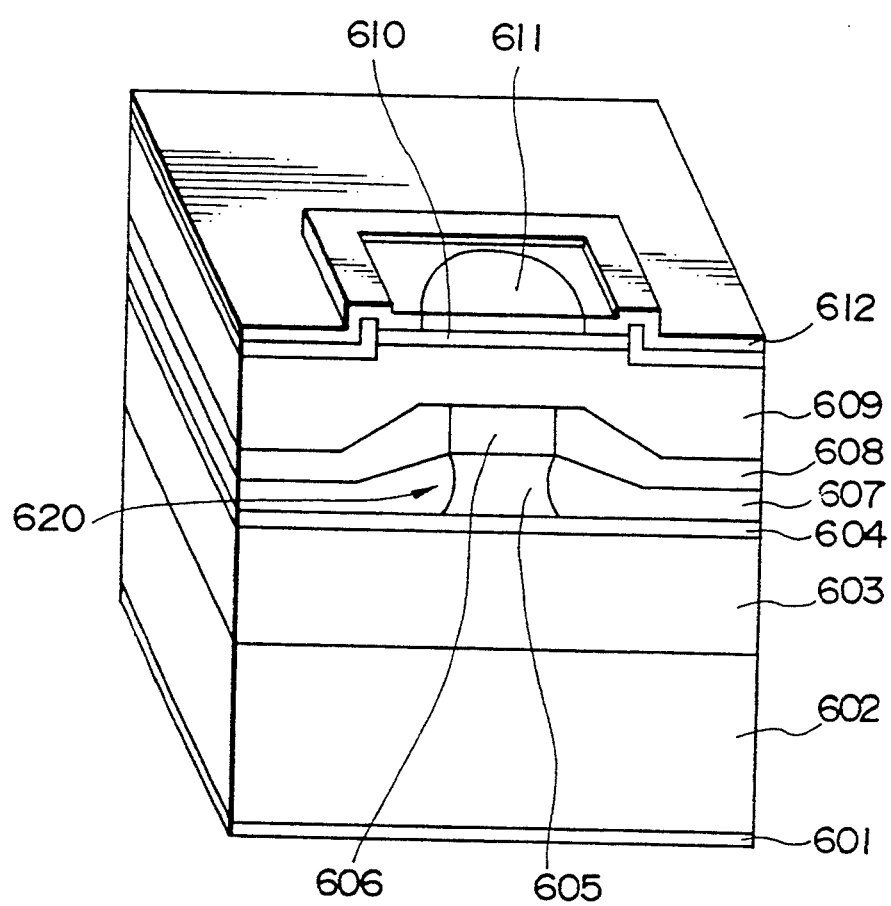
FIG. 12 is a perspective view of a surface emission type semiconductor laser constructed according to the prior art, illustrating the light emitting portion thereof.

FIG. 8 shows the arrangements of the surface emission type semiconductor lasers constructed respectively in accordance with the prior art and the present invention at the exit sides thereof and intensity profiles of NFP when the laser beam is generated. FIG. 8(a) shows that the resonators 620 of the prior art surface emission type semiconductor laser 600 shown in FIG. 12 are arranged close to one another up to a distance by which the resonators can be fully covered by the epitaxial layers of GaAlAs 607 and 608 connected with each other at the n-p junction, that is, a distance equal to about 5 μm. Although the exit face of the laser actually includes the multi-layered dielectric film mirror and the p-type ohmic electrode formed thereon, they are omitted in FIG. 8 for clear illustration. FIG. 8(b) shows an intensity profile of NFP between points a and b in FIG. 8(a). The prior art surface emission type semiconductor laser only provides a plurality of adjacent light spots even if a plurality of light emitting portions 620 are arranged close to each other.

Figure 8A:
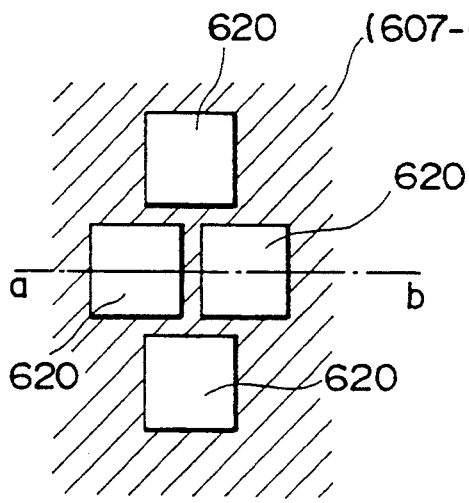
FIGS. 8a-8d illustrate differences in shape and near field pattern between the surface emission type semiconductor laser constructed according to the prior art and the semiconductor laser of FIG. 6.
Figure 8C:
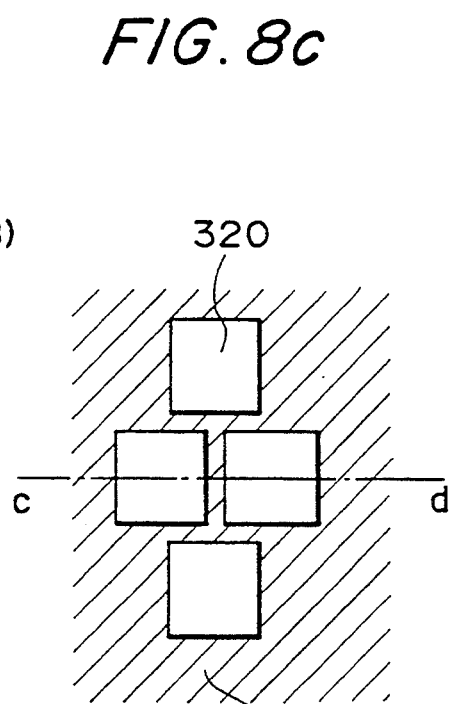
Figure 8B:
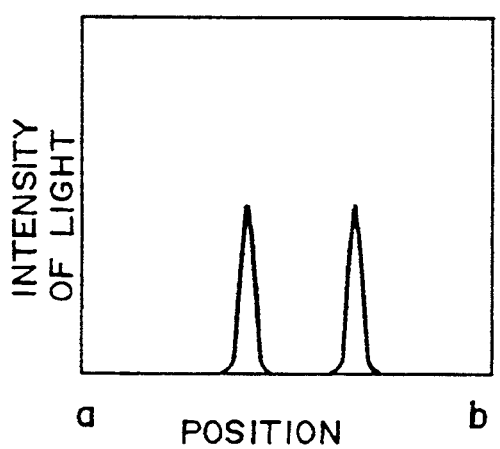
Figure 8D:
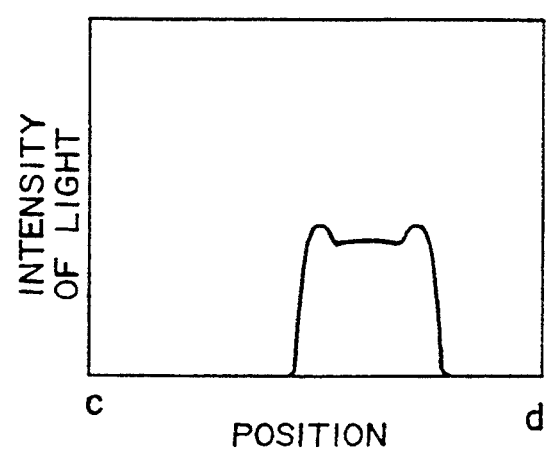
Figure 10A:
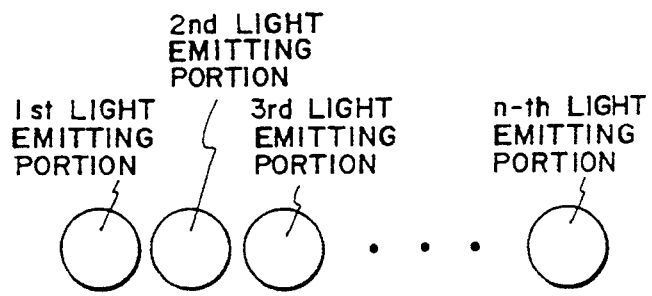
FIGS. 10(a) to (d) schematically illustrate various shapes of surface emission type semiconductor lasers constructed according to still further embodiments of the present invention at the exit sides thereof.
Figure 10B:
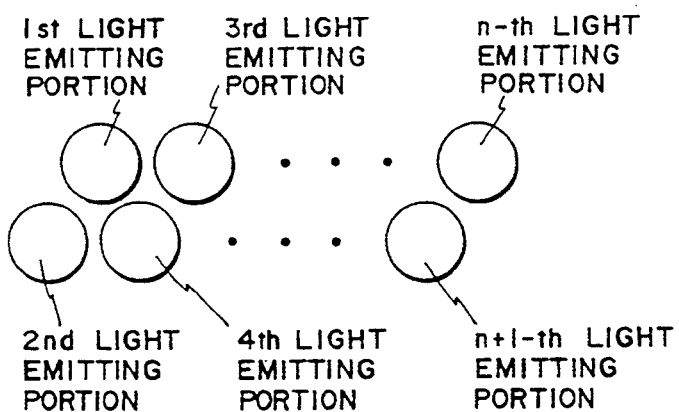
Figure 10C:
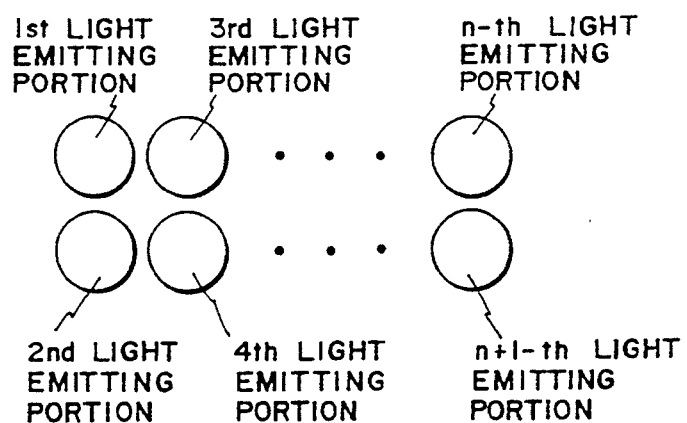
Figure 10D:
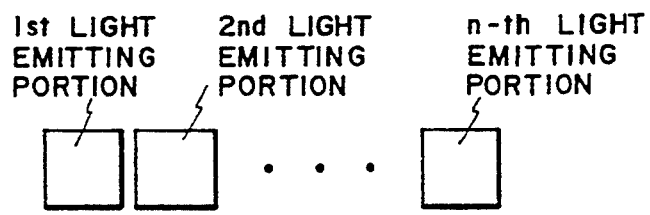

FIG. 8(c) shows the arrangement of the exit end of the surface emission type semiconductor laser constructed according to this embodiment wherein the separation groove is filled with a $ZnS_{0.06}Se_{0.94}$ layer 309 formed by the vapor phase epitaxy method. Thus, the minimum width of the separation groove can be equal to one μm. FIG. 8(d) shows NFP between points c and d in FIG. 8(c). It will be apparent from this NFP that the light emission spot is enlarged since light rays exit also from above the separation groove 314. Since the adjacent laser beams are synchronized with each other in phase, the light output can be increased with an angle of radiation being equal to or less than one degree.

Table 2 shows the relationship between the width of the separation groove of the surface emission type semiconductor laser 300 and the order of transverse generation mode measured from NFP.

TABLE 2

| Width of Separation Groove | Mode of Near Field Pattern |
| --- | --- |
| 0.5 μm | Zero-Order Basic Mode |
| 1.0 μm | Zero-Order Basic Mode |
| 5.0 μm | Zero-Order Basic Mode |
| 10 μm | First Order Mode |
| 20 μm | Higher-Order Mode |

If the width of the separative groove is less than 10 μm, the transverse generation mode of the laser synchronized in phase is in the basic mode. If the width is equal to or more than 10 μm, the laser will be generated in an order equal to or higher than one. In this case, the laser beam will be of an elliptic configuration with its increased angle of radiation. This is undesirable in all applications. If the separation groove has a width less than 0.5 μm, the laser beam will not be circular.

Although the embodiments have been described as to a single optical resonator including a plurality of light emitting portions spaced away from one another, a plurality of such optical resonators may be formed on the same semiconductor substrate. If each of the optical resonators has a p-type ohmic electrode at its exit side, a laser beam from each optical resonator may be independently controlled with respect to ON, OFF and modulation.

Although the embodiments have been described as to the surface emission type semiconductor laser made of GaAlAs materials, the other III-V group compounds may be equivalently used in the present invention. Particularly, the generation wavelength may be varied by changing the composition of Al in the active layer of GaAlAs.

Although this embodiment has been described in connection with the structure shown in FIG. 6 and the light emitting portion shown in FIG. 8(c), the present invention is not limited to such an arrangement.

Figure 11A:
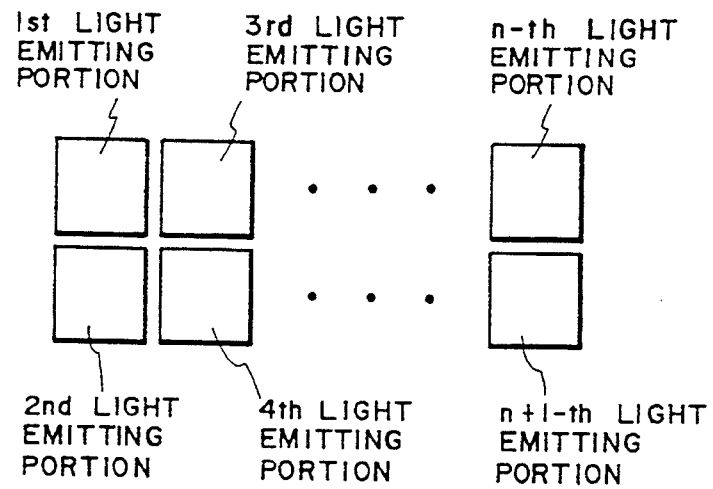
FIGS. 11(a) to (c) schematically illustrate various shapes of surface emission type semiconductor lasers constructed according to other embodiments of the present invention at the exit sides thereof.
Figure 11B:
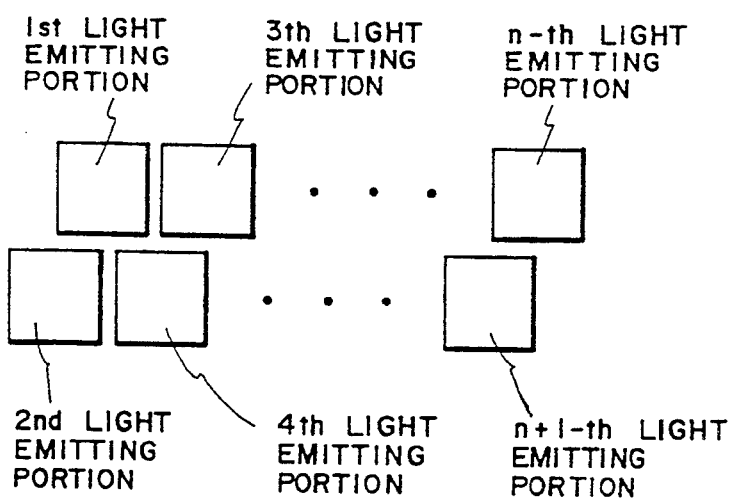
Figure 11C:
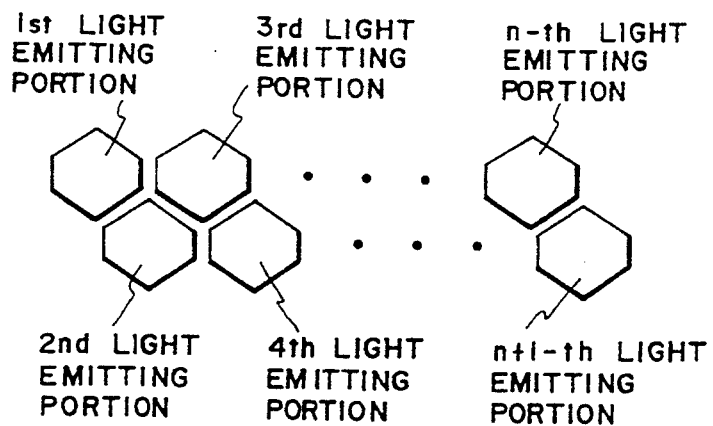

FIGS. 9 to 11 show the other embodiments of the present invention in which various configurations and arrangements of optical resonators and associated separation grooves in a plane parallel to the substrate as viewed from the exit side are schematically illustrated. FIGS. 9(a)–(j) and (m) represent line symmetry arrangements in which a plurality of column-like semiconductor layers each having a circular or regularly polygonal cross-section parallel to the substrate are formed. In any event, the light emitting spot formed by any one of such arrangements can have a dimension larger than that of a light emitting spot formed by a single light emitting portion. When it is desired to provide a single circular cross-sectional laser beam having a relatively large diameter from the respective light emitting portions and separation groove, the cross-section of each of the light emitting portions may be any configuration other than circle or regular polygon. The essential requirement in the concept of the present invention is that a non-circular or non-polygonal line joining the outer edges of the light emitting portions arranged in line symmetry approximate to a circular or regularly polygonal configuration. So, the configurations shown in FIG. 9(k) and (l) are suitable for generating the laser beam having larger diameter. Each of embodiments shown in FIGS. 10(a)–(d) and 11(a)–(c) includes light emitting portions of n in number and is advantageous in that it can produce a light emitting spot formed into any desirable size and form. In addition to the same advantages as in the embodiment of FIG. 6. In all the embodiments shown in FIGS. 10 and 11, a line beam may be provided by disposing a plurality of light emitting portions in row and/or column on a two-dimensional plane parallel to the substrate.

In the embodiment shown in FIG. 6, there may be produced a semiconductor laser which comprises a plurality of spaced p-type ohmic electrodes 310 equal in number to the light emitting portions 320, these electrodes 310 being connected with the contact layer 308. In such a case, each of the light emitting portions will generate a beam having a circular cross-section which can be independently controlled in ON, OFF and modulation, these beams being synchronized with one another in phase.

Figure 13A:
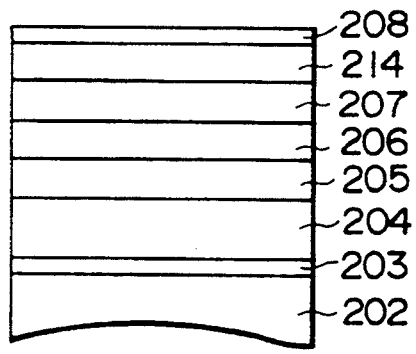
FIGS. 13a-13p are cross-sectional views illustrating various modifications of the process in FIG. 5 according to the present invention.
Figure 13E:
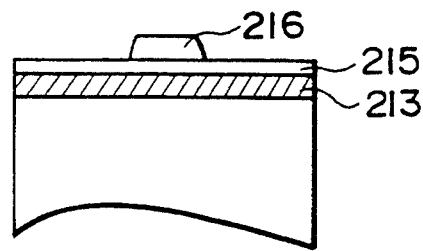
Figure 13B:
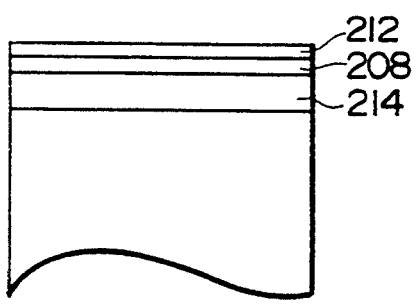
Figure 13F:
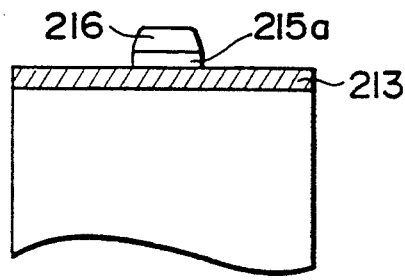
Figure 13C:
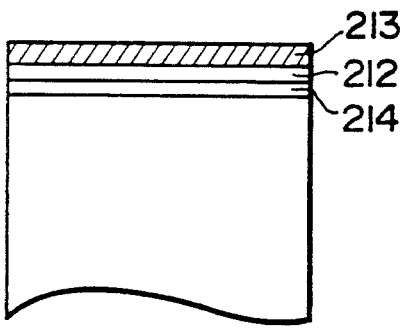
Figure 13G:
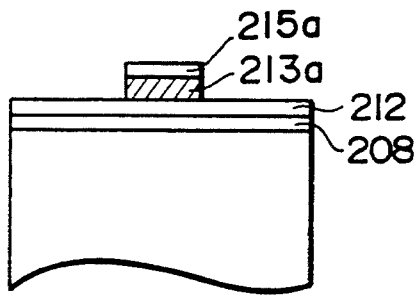
Figure 13D:
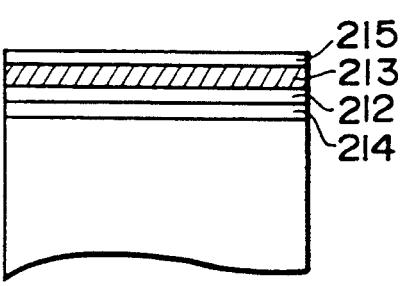
Figure 13H:
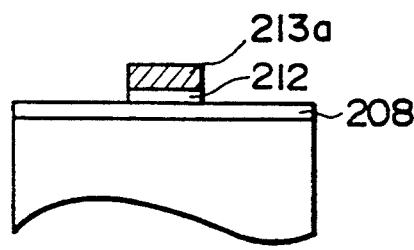
Figure 13I:
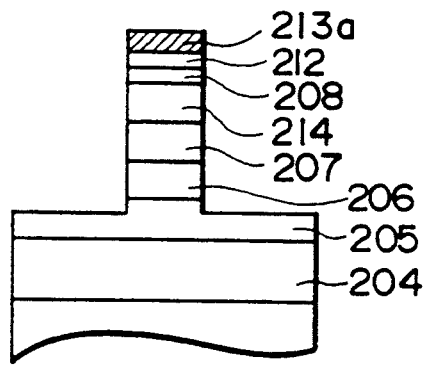
Figure 13M:
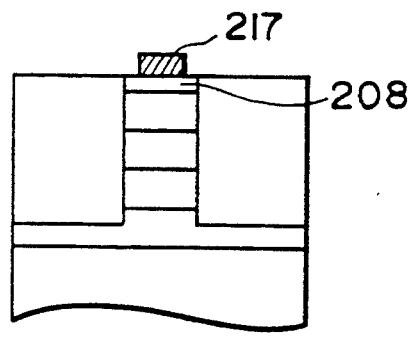
Figure 13J:
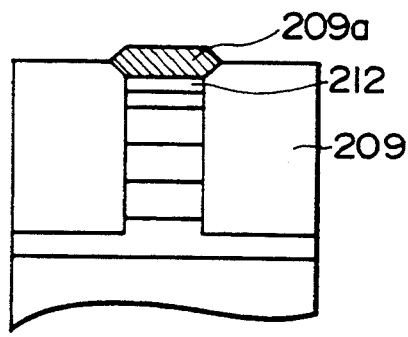
Figure 13N:
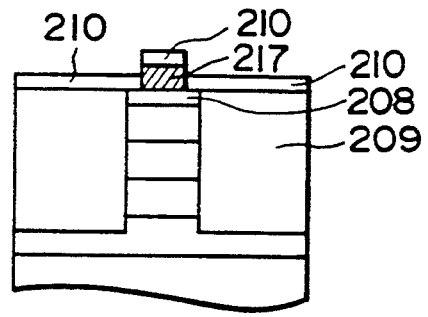
Figure 13K:
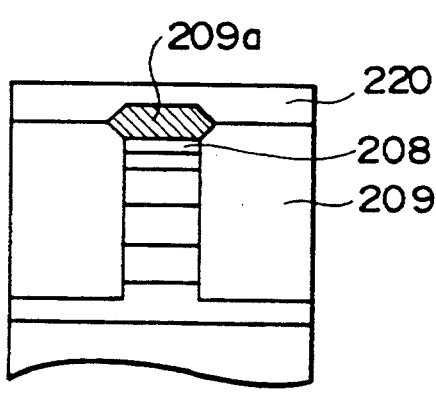
Figure 13O:
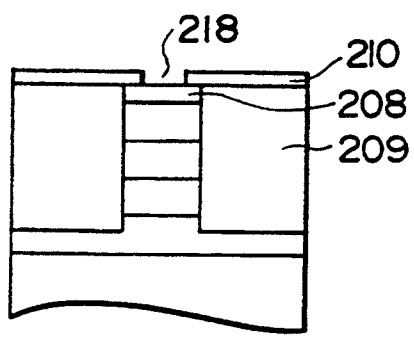
Figure 13L:
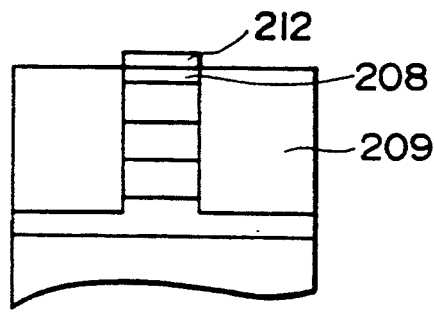
Figure 13P:
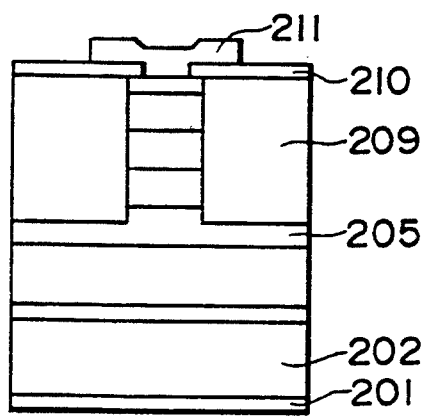

Referring next to FIGS. 13a–13p, there is shown a further embodiment of the present invention which is suitable for providing a resonator perpendicular to the plane of a semiconductor substrate.

In FIGS. 13a–13p it is to be understood that various layers similar to those of FIGS. 5a–5e are denoted by similar reference numerals and will not be further described.

FIG. 13a shows a process substantially similar to that of FIG. 5a which forms the semiconductor epitaxial layers. The process of FIG. 13a is different from that of FIG. 5a in that the former is adapted to form five pairs of distributed-reflection type multilayered film mirrors 214 between a cladding layer 207 and a contact layer 208. Each of the multilayered film mirrors 214 comprises a p-type layer of $Al_{0.7}Ga_{0.3}As$ and a p-type layer of $Al_{0.1}Ga_{0.9}As$ and has a reflectivity equal to or higher than 75% against a light which has a wavelength equal to about 870 nm. The formation of these mirrors 214 is intended to increase the reflectivity under a p-type ohmic electrode 210 (to be described later) in the resonator to provide a high-frequency surface emission type semiconductor laser.

FIG. 13b shows a process of forming a layer of $SiO_2$ 212 on the top of the multilayered structure 203–208 and 214 by the use of thermal CVD process after epitaxial growth. The $SiO_2$ layer 212 can function as an effective etching stop layer in a flattening process which will be described, if the film thickness thereof is proper.

FIG. 13c shows a forming process of a hard baked resist 213 which can be formed by applying a first photoresist on the $SiO_2$ layer 212 with spin coating and then baking the first photoresist, for example, at 250° C. for 1 hour. The hard baked resist 213 is patterned to provide a resist pattern 213a in an etching step shown in FIG. 13g. In an etching step of FIG. 13i, thereafter, the resist pattern 213a is utilized as a mask for forming a resonator having lateral sides which are perpendicular to the substrate.

FIG. 13d shows the formation of an etchable film 215 on the hard baked resist 213. The film 215 may be formed by vapor depositing Ti on the hard baked resist 213 using electron beam deposition, for example. Alternatively, the film 215 may be formed by sputtering of $SiO_2$ or SiN. The thickness of the film 215 should be smaller than that of at least the hard baked resist 213 located under the film 215 and the thickness preferably ranges from 1000 Angstroms to 1 μm. The film 215 is preferably as thin as possible. However, if the thickness of the film 215 is less than 1000 Angsttoms, the film thickness will vary at every step. Therefore, it is more preferable if the film thickness ranges from 1000 Angsttoms to 2000 Angstroms.

FIG. 13e shows the formation of a resist pattern 216 on the film 215. The resist pattern 216 may be provided by forming a second photoresist layer on the film 215 and then forming a pattern corresponding to the external diameter of the vertical resonator using the conventional photolithograph. At this time, the sides of the resist pattern 216 are not necessarily required to be perpendicular to the semiconductor substrate.

FIG. 13f shows the formation of a film pattern 215a by etching the film 215 using the resist pattern 216 as a mask. The etching of the film 215 may be either by wet etching with an acid solution such as buffer fluorine acid or dry etching with RIE using $CF_4$ gas. The latter is superior to the former in pattern reproduction and/or yield.

Although the film 215 has been described to be formed of Ti, it may be replaced by $SiO_2$ or SiN to provide the RIE etching similar to that described above.

FIG. 13g shows the etching of the hard baked resist 213 through the film pattern 215a as a mask after the resist pattern 216 has been removed. Since the film pattern 215a is of very small thickness, the film pattern 215a is macroscopically considered to be a pattern having sides perpendicular to the semiconductor substrate. Therefore, the side faces of the hard baked resist pattern 213a will also be perpendicular to the semiconductor substrate for the vertical sides of the film pattern 215a when the film 215a is used as a mask to etch the underlying hard baked resist 213 by the use of, for instance, $O_2$ gas in the RIE process.

FIG. 13h shows the etching of the underlying layer of $SiO_2$ 212 using the hard baked resist pattern 213a as a mask by, for example, RIE process, after the film pattern 215a has been removed by etching. In such a manner, a mask usable in etching the vertical resonator of FIG. 13i will be completed. In the present embodiment, the etching mask for resonator is referred to as a three-layer mask since it comprises three layers, that is, the hard baked resist 213, film 215 and resist pattern 216, as shown in FIGS. 13c–13g.

FIG. 13i shows the same process as in FIG. 5b. More particular, FIG. 13i shows the etching of the cladding layer 205 up to the midway by use of the RIBE process, leaving a column-like light emitting portion covered with the hard baked resist pattern 213a. Since the sides of the hard baked resist pattern 213a are vertical and the etching is carried out along the vertical sides of the hard baked resist pattern 213a by the RIBE process, there may be provided a resonator having sides which are perpendicular to the substrate. The etching step is performed under the same conditions as in FIG. 5b. When the etching steps shown in FIGS. 13i and 5b are to be performed, the temperature of the substrate preferably ranges between 10° C. and 40° C. and more preferably between 15° C. and 20° C. By controlling the temperature of the substrate in such a manner, the temperature can be prevented from excessively increasing as the etching is being made to form the column-like light emitting portion. As a result, the etching rate can be maintained constant so that the resonator will have side faces perpendicular to the substrate surface.

FIG. 13j shows the formation of a buried layer 209 after the hard baked resist pattern 213a has been removed, the buried layer 209 being filled with the II-VI group compound semiconductor epitaxial layer. The buried layer 209 is preferably formed of any adduct organic metal through MOCVD process. This provides a process which may be carried out with lower temperatures. Since the cladding layer 205 is single crystalline, the buried layer grown on such a single crystal will also be a single crystal of ZnSSe 209. On the other hand, since the layer of $SiO_2$ 212 on the surface layer of the column-like resonator is polycrystalline, a polycrystalline layer of ZnSSe 209a will be formed on the layer 212. In addition, there is a difference in level between the surfaces of the layers 209 and 209a since the polycrystalline layer of ZnSSe 209a is formed protruding beyond the single crystalline layer of ZnSSe 209.

FIGS. 13k and 13l show a flattening process of providing the single crystalline layer of ZnSSe 209 which has its surface substantially flush with that of the contact layer 208.

Referring to FIG. 13k, a layer having a flat surface, such as a resist layer 220, is first formed on the layers of ZnSSe 209 and 209a which are different in crystalline structure from each other. The resist layer 220 may be formed by, for example, the conventional spin coating process, but is preferably formed by using a resist liquid having a reduced viscosity so that the resist layer 220 can have its flat surface over the layers 209 and 209a of which surfaces are different in level from each other. After the resist layer 220 has been formed by the spin coating process, it may be heated. In such a case, the viscosity in the resist layer 220 can be reduced so that the surface thereof can be flattened. The flat layer can be formed of any suitable material which is easily made into a layer and is not different in etching rate from the single crystalline and polycrystalline ZnSSe layers 209 and 209a, such as polyimide.

FIG. 13l shows the etching step of the resist layer 220, polycrystalline ZnSSe layer 209a and single crystalline ZnSSe layer 209. In this etching step, it is important that the polycrystalline ZnSSe layer 209a is fully etched while at the same time the single crystalline ZnSSe layer 209 is etched without creation of any difference in level from the surface of the column-like light emitting portion or contact layer 208. If both the layer 209a and 209 are etched without formation of the resist layer 220, the etching will proceed while forming the top of the column-like resonator into an upwardly convex configuration. This means that the thickness of the single crystalline ZnSSe layer 209 surrounding the surface of the column-like resonator or contact layer 208 is reduced when the contact layer 208 is exposed by etching. In other words, the surface of the single crystalline ZnSSe layer 209 will become lower than the surface of the contact layer 208. When the thickness of the single crystalline ZnSSe layer 209 is reduced in such a manner, the function of the buried layer is degraded by a reduced magnitude of thickness so that the current will tend to leak, with the reactive current undesirably being increased. In addition, electrode 210 to be formed on the surfaces of both the contact and buried layers 208, 209 will tend to be cut if there is a difference in level between these surfaces. Such a difference in level provides flashes which damage the electrical connection and reduce the yield.

Since the resist layer 220 is formed to have a flat surface in the present embodiment, the layers 209, 209a and 220 can be etched while maintaining their surfaces flat. This is because the layers 209, 209a and 220 have substantially the same etching rate. When the polycrystalline ZnSSe layer 209a has been completely etched, the underlying layer of SiO$_2$ 212 will be exposed. However, the etching is continued. Since the etching rate of the layer of SiO$_2$ 212 is lower than that of the single crystalline ZnSSe layer 209, the layer of SiO$_2$ 212 will necessarily remain when the surface of the layer 209 is etched to be flush with that of the contact layer 208. If the end of etching in the single crystalline ZnSSe layer 209 is set depending on the state of exposure of the layer 212, the etching can be carried out without making any difference in level between the contact and buried layers 208, 209. The end of etching may be set by either of an etching time period control process or a process for detecting a plasma emitting spectrum produced when SiO$_2$ is etched. In either case, it is required to preset the thickness of the SiO$_2$ layer 212 so that it can be completely exposed at the end of etching. Although the present embodiment has been described as to the formation of the etching stop layer 212 from SiO$_2$, the etching stop layer 212 may be formed of any other suitable material such as SiN if it fulfills two conditions, that is, (1) the material is of a polycrystalline structure and (2) the material has an etching rate lower than that of the II-VI group compound semiconductor layer.

Subsequently, the steps shown in FIGS. 13m–13p are carried out to form a p-type ohmic electrode 210, an SiO$_2$/a-Si dielectric multilayered film mirror 211 and an n-type ohmic electrode 201. These steps are different from the steps of FIGS. 5d and 5e in that the p-type ohmic electrode 210 is formed prior to formation of the multilayered film mirror 211. More particularly, the step of FIG. 13m forms a resist pattern 217 on the surface of the contact layer 208 at an area having a diameter which is smaller than that of the resonator. This area becomes an opening. Thereafter, the step of FIG. 13n deposits the p-type ohmic electrode 210 on the buried layer 209 and the resist pattern 217. Subsequently, this component is immersed in an organic solvent such as acetone to dissolve the resist pattern 217. At the same time, the p-type ohmic electrode 210 is removed from the resist pattern 217 to form an opening 218 having no electrode on the surface of the resonator, as shown in FIG. 13o. This is called "electrode lifting-off". As shown in FIG. 13p, the multilayered film mirror 211 is formed over the opening 218 by, for example, electric beam deposition.

It is to be understood that the surface emission type semiconductor laser of the present invention may be equivalently applied to any desirable light source in various devices such as printers, copying machines, facsimile machines, displays, and so on.

What is claimed is:

1. A method of making a surface emission type semiconductor laser for emitting a laser beam in a direction perpendicular to a semiconductor substrate, comprising the steps of forming a multilayered semiconductor layer on said semiconductor substrate to define at least one optical resonator means including a pair of reflecting mirrors and a plurality of semiconductor layers between said pair of reflecting mirrors; forming a photoresist mask on said multilayered semiconductor layer; etching the layers including at least a cladding layer in said multilayered semiconductor layer by the use of said photoresist mask to form at least one column-like portion; and forming a II-VI group compound semiconductor epitaxial layer surrounding said at least one column-like portion by vapor phase epitaxy method to form a buried layer.

2. A method as defined in claim 1, wherein said etching step is terminated leaving a part of said cladding layer such that an active layer underlying said cladding layer is not exposed.

3. A method as defined in claim 1, wherein said photoresist mask is formed by subjecting a hard baked photoresist layer to a reactive ion etching process, whereby side walls of said photoresist mask are perpendicular to said semiconductor substrate.

4. A method as defined in claim 3, wherein said photoresist mask is used to form said at least one column-like portion through a reactive ion beam etching process, whereby the side walls of said at least one column-like portion are perpendicular to said semiconductor substrate.

5. A method as defined in claim 1, wherein a plurality of said column-like portions are formed by the etching using said photoresist mask and wherein a separation groove is formed between each pair of adjacent column-like portions, said separation groove having a minimum width equal to about 1 μm.

6. A method as defined in claim 5, wherein said etching step is terminated leaving a part of said cladding layer so that each of said separation grooves will not reach an active layer underlying said cladding layer.

7. A method as defined in claim 6, wherein said II-VI group compound semiconductor epitaxial layer is transparent to the wavelength of an emitted laser beam and is vapor grown in each of said separation grooves.

8. A method as defined in claim 3, further comprising the steps of forming a film having a thickness smaller than a thickness of said hard baked photoresist layer on said hard baked photoresist layer, forming a second photoresist layer on said film and forming a resist pattern from said second photoresist layer by a photolithograph step, etching said film through said resist pattern as a mask to form a film mask having sides perpendicular to said semiconductor substrate by a reactive ion etching process, and etching said hard baked photoresist layer through said film mask to form said photoresist mask by a reactive ion etching process.

9. A method as defined in claim 8, wherein said photoresist mask is used to form said at least one column-like portion by a reactive ion beam etching process and wherein said at least one column-like portion has sides perpendicular to said semiconductor substrate.

10. A method as defined in claim 8, wherein said film is formed of a material selected from a group consisting of Ti, $SiO_2$ and SiN.

11. A method as defined in claim 8, wherein the thickness of said film ranges from 1000 Angstroms to 1 μm.

12. A method as defined in claim 8, further comprising the steps of previously forming a polycrystalline etching stop layer having an etching rate lower than an etching rate of said II-VI group compound semiconductor epitaxial layer between said multilayered semiconductor layer and said hard baked photoresist layer, forming a polycrystalline II-VI group compound semiconductor layer on said etching stop layer on the vapor growth of said II-VI group compound semiconductor epitaxial layer after said photoresist mask has been removed, said polycrystalline II-VI group compound semiconductor layer protruding beyond said II-VI group compound semiconductor epitaxial layer, forming a layer having a flat surface on said polycrystalline II-VI group compound semiconductor layer and said II-VI group compound semiconductor epitaxial layer, etching said flat layer, said polycrystalline II-VI group compound semiconductor layer and said II-VI group compound semiconductor epitaxial layer and detecting the end of etching depending on the degree of exposure of said etching stop layer so that the surface of said II-VI group compound semiconductor epitaxial layer is etched to be substantially flush with the surface of said at least one column-like portion.

13. A method as defined in claim 12, wherein the thickness of said etching stop layer is set sufficiently to be exposed when said polycrystalline II-VI group compound semiconductor layer on the etching stop layer is etched and before the surfaces of said at least one column-like portion becomes substantially flush with the surface of said II-VI group compound semiconductor epitaxial layer.

14. A method as defined in claim 13, wherein said etching stop layer is formed of a material selected from a group consisting of $SiO_2$ and SiN.

15. A method as defined in claim 12, wherein said flat layer is formed of a material selected from a group consisting of resist material and polyimide.

16. A method as defined in claim 1, wherein said photoresist mask is used to form said at least one column-like portion through a reactive ion beam etching process, so that the side walls of said at least one column-like portion are perpendicular to said semiconductor substrate.

17. A method as defined in claim 1, wherein said II-VI group compound semiconductor epitaxial layer is transparent for a generation wavelength of the surface emission type semiconductor laser.

* * * * *